US012755784B2

(12) United States Patent
Choi et al.

(10) Patent No.: US 12,755,784 B2
(45) Date of Patent: Oct. 6, 2026

(54) MEMORY DEVICES FOR IMPLEMENTING READ OPERATION OF BIDIRECTIONAL SELECTOR ONLY MEMORY (SOM) CELLS

(71) Applicant: Samsung Electronics Co., Ltd., Suwon-si (KR)

(72) Inventors: Yoonseong Choi, Suwon-si (KR); Kwangjin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 18/982,139

(22) Filed: Dec. 16, 2024

(65) Prior Publication Data

US 2025/0232809 A1 Jul. 17, 2025

(30) Foreign Application Priority Data

Jan. 17, 2024 (KR) ........................ 10-2024-0007641

(51) Int. Cl.
*G11C 13/00* (2006.01)
*H10B 63/00* (2023.01)
*H10B 63/10* (2023.01)

(52) U.S. Cl.
CPC ........ *G11C 13/004* (2013.01); *G11C 13/0069* (2013.01); *H10B 63/10* (2023.02); *H10B 63/30* (2023.02)

(58) Field of Classification Search
CPC .............. G11C 13/004; G11C 13/0069; G11C 16/08; G11C 16/12; G11C 16/24; G11C 16/26; G11C 16/34; G11C 13/0004; G11C 13/003; H10B 63/10; H10B 63/30
USPC ........................................... 365/189.011, 205
See application file for complete search history.

(56) References Cited

U.S. PATENT DOCUMENTS 6,222,762 B1 * 4/2001 Guterman ............ G11C 27/005 365/185.21
6,590,805 B2 7/2003 Lu et al.
6,678,187 B2 1/2004 Sugibayashi et al.
8,228,711 B2 7/2012 Kim et al.
8,619,458 B2 12/2013 Baek et al.
9,111,623 B1 8/2015 Jung et al.
9,285,997 B2 3/2016 Tanzawa
10,726,898 B1 7/2020 Maffitt et al.
11,049,550 B1 * 6/2021 Chang ................. G11C 11/4074
(Continued)

FOREIGN PATENT DOCUMENTS

CN 110556137 A 12/2019

*Primary Examiner* — Michael T Tran
(74) *Attorney, Agent, or Firm* — Muir Patent Law, PLLC

(57) ABSTRACT

A memory device performs a read operation of bidirectional switching memory cells. The memory device includes a plurality of memory cells, each of the plurality of memory cells including a material film, an access circuit, and a sense circuit. A logic state of the material film is programmed based on whether the material film is in a crystalline state or an amorphous state. The access circuit applies a first voltage to a first electrode of a selected memory cell from among the plurality of memory cells and applies a second voltage to a second electrode of the selected memory cell, and the sense circuit determines a logic state of the selected memory cell based on electrical reactions of a first sensing node and a second sensing node connected to the selected memory cell with regard to the first voltage and the second voltage.

20 Claims, 14 Drawing Sheets

(56) References Cited

U.S. PATENT DOCUMENTS

| | | | | |
|---|---|---|---|---|
| 2006/0067147 | A1* | 3/2006 | Roehr | G11C 13/0026 365/207 |
| 2006/0158947 | A1* | 7/2006 | Chan | G11C 16/26 365/210.12 |
| 2015/0071020 | A1 | 3/2015 | Javanifard | |
| 2019/0088873 | A1 | 3/2019 | Fantini et al. | |
| 2020/0058351 | A1* | 2/2020 | Shin | G11C 13/0038 |
| 2020/0286553 | A1* | 9/2020 | Hung | G11C 13/004 |
| 2022/0115055 | A1* | 4/2022 | Park | G11C 13/004 |
| 2022/0375529 | A1* | 11/2022 | Yamazaki | G11C 16/0483 |

* cited by examiner

MEMORY DEVICES FOR IMPLEMENTING READ OPERATION OF BIDIRECTIONAL SELECTOR ONLY MEMORY (SOM) CELLS

CROSS-REFERENCE TO RELATED APPLICATION(S)

This application is based on and claims priority under 35 U.S.C. § 119 to Korean Patent Application No. 10-2024-007641, filed on Jan. 17, 2024, in the Korean Intellectual Property Office, the disclosure of which is incorporated by reference herein in its entirety.

BACKGROUND

The inventive concept relates to semiconductor memory devices, and more particularly, to memory devices for implementing a read operation of bidirectional selector only memory cells.

As non-volatile memory devices, resistive memory devices such as phase change random access memory (PRAM), resistive RAM (RRAM), magnetic RAM (MRAM), etc. are known. Resistive memory devices use variable resistors that store data by changing the resistance state thereof as memory cells. A cross-point type resistive memory device is configured by arranging such memory cells at intersections between a plurality of bit lines and a plurality of word lines.

A resistive memory device may store data in memory cells using an Ovonic threshold switching (OTS) device. An OTS device may include a semiconductor material in an amorphous state or a crystalline state disposed between a first electrode and a second electrode. An OTS device exhibits characteristics in which a current rapidly increases non-linearly at or above a positive (+) threshold voltage applied between a first electrode and a second electrode and the current rapidly increases non-linearly at or above a negative (−) threshold voltage (see FIG. 4). The OTS element is turned on in response to the positive (+) threshold voltage applied between the first electrode and the second electrode and is turned on in response to the negative (−) threshold voltage. In other words, the OTS device functions as a bidirectional selection device (sometimes called a double polarity device). The change in voltages applied to the first electrode and the second electrode of the OTS device may be expressed as a current to exhibit a memory function. Such a bidirectional selection memory cell stores either logic “1” (sometimes referred to as set data, a crystalline state, or a low threshold voltage state) or logic “0” (sometimes referred to as reset data, an amorphous state, or a high threshold voltage state) based on the threshold voltage of the bidirectional selection memory cell.

In a read operation of reading a logic state of a memory cell according to a change in resistance of a bidirectional selection memory cell, a sense circuit of a resistive memory device may have asymmetry or a sensing margin may be reduced, resulting in read errors. Therefore, an operation method capable of reducing read errors of a resistive memory device and securing a sensing margin is demanded.

SUMMARY

The inventive concept provides memory devices that perform a read operation of bidirectional selection memory cells.

According to an aspect of the inventive concept, there is provided a memory device including a memory cell array including a plurality of memory cells, each of the plurality of memory cells including a material film, a first electrode on a first side of the material film, and a second electrode on a second side of the material film opposite to the first side, wherein a logic state of the material film is programmed based on whether the material film is in a crystalline state or an amorphous state, an access circuit configured to apply a first voltage to a first electrode of a selected memory cell from among the plurality of memory cells and apply a second voltage to a second electrode of the selected memory cell, and a sense circuit configured to determine a logic state of the selected memory cell based on electrical reactions of a first sensing node and a second sensing node connected to the selected memory cell with regard to the first voltage and the second voltage, wherein the sense circuit includes a switch configured to electrically connect the first sensing node to the second sensing node based on a read signal, a capacitor connected between the second sensing node and a sensing input node, a pre-charger configured to pre-charge the sensing input node with a pre-charge voltage based on a pre-charge control signal, and a comparing circuit configured to compare a voltage level of the sensing input node with a voltage level of a reference voltage and output a signal indicating the logic state of the selected memory cell.

According to another aspect of the inventive concept, there is provided a memory device including a memory cell array including a plurality of memory cells, each of the plurality of memory cells including a material film, a first electrode on a first side of the material film, and a second electrode on a second side of the material film, wherein a logic state of the material film is programmed based on whether the material film is in a crystalline state or an amorphous state, an access circuit configured to apply a first voltage to a first electrode of a selected memory cell from among the plurality of memory cells and apply a second voltage to a second electrode of the selected memory cell, and a sense circuit configured to determine a logic state of the selected memory cell based on electrical reactions of a first sensing node and a second sensing node connected to the selected memory cell with regard to the first voltage and the second voltage, wherein the sense circuit includes a capacitor connected between the first sensing node and the second sensing node, a pre-charger configured to pre-charge a first end of the capacitor to a voltage level of a pre-charge voltage, and a comparing circuit configured to compare a voltage level of the first end of the capacitor with a voltage level of a reference voltage and output a signal indicating the logic state of the selected memory cell.

According to another aspect of the inventive concept, there is provided a memory device including a memory cell array including a plurality of memory cells, each of the plurality of memory cells including a material film, a first electrode on a first side of the material film, and a second electrode on a second side of the material film, wherein a logic state of the material film is programmed based on whether the material film is in a crystalline state or an amorphous state, an access circuit configured to apply a first voltage to a first electrode of a selected memory cell from among the plurality of memory cells and apply a second voltage to a second electrode of the selected memory cell, and a sense circuit configured to determine a logic state of the selected memory cell based on electrical reactions of a first sensing node and a second sensing node connected to the selected memory cell with regard to the first voltage and the second voltage, wherein the sense circuit includes a first capacitor connected between the first sensing node and a sensing input node, a second capacitor connected between the second sensing node and the sensing input node, a pre-charger configured to pre-charge the sensing input node with a pre-charge voltage based on a pre-charge control signal, and a comparing circuit configured to compare a voltage level of the sensing input node with a voltage level of a reference voltage and output a signal indicating the logic state of the selected memory cell.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
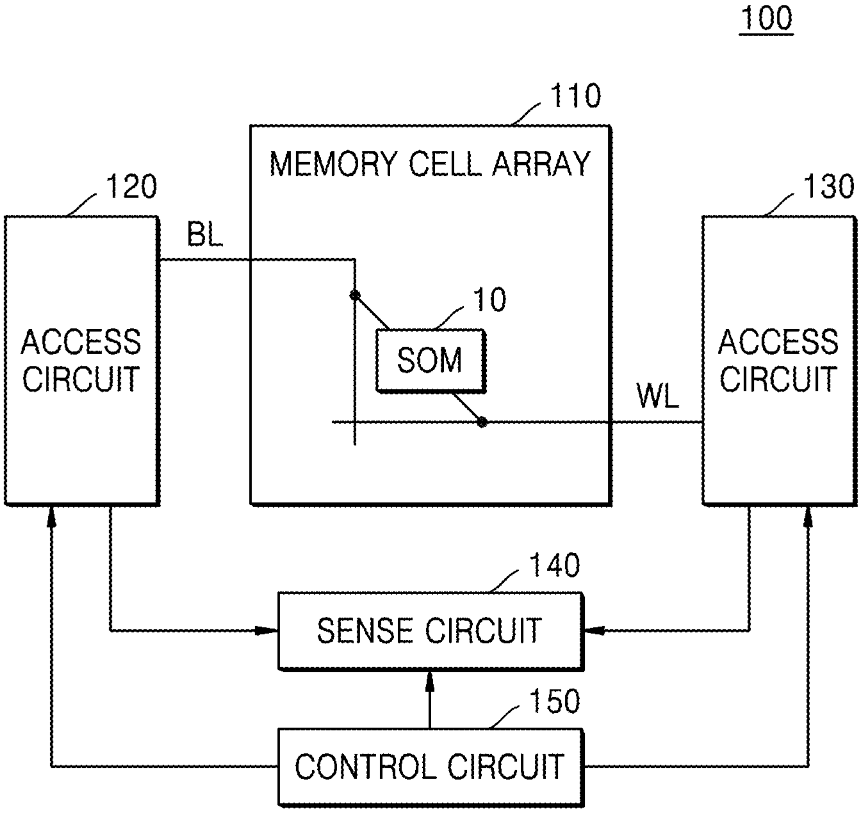
FIG. 1 is a diagram conceptually showing a memory device according to example embodiments.
Figure 2:
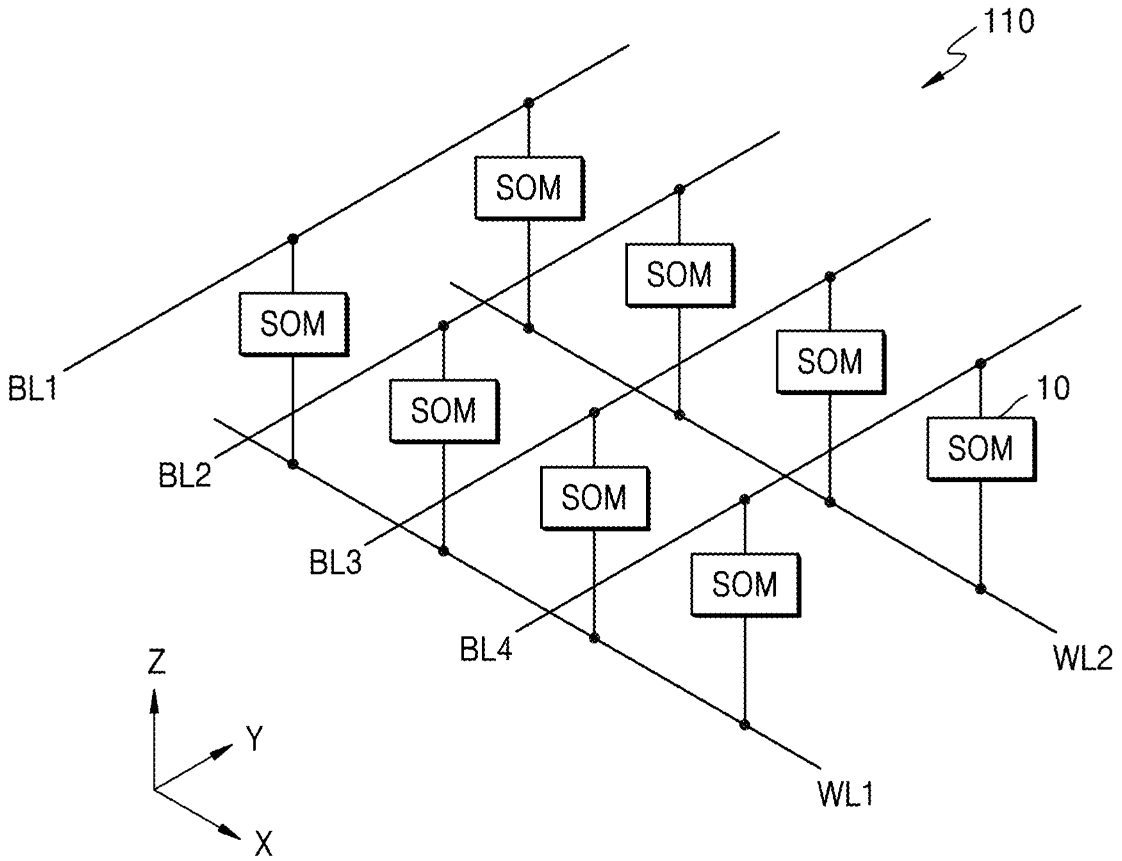
FIG. 2 shows the configuration of a memory cell array of FIG. 1 according to example embodiments.
Figure 3:
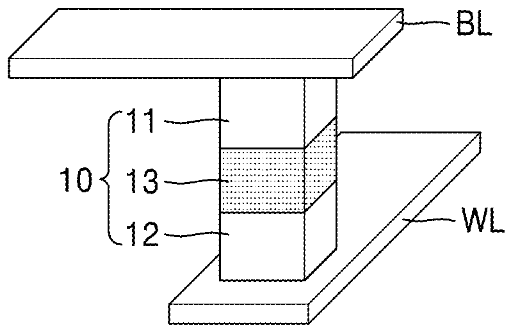
FIG. 3 is a diagram showing a structure of a memory cell of FIG. 1 according to example embodiments.
Figure 4:
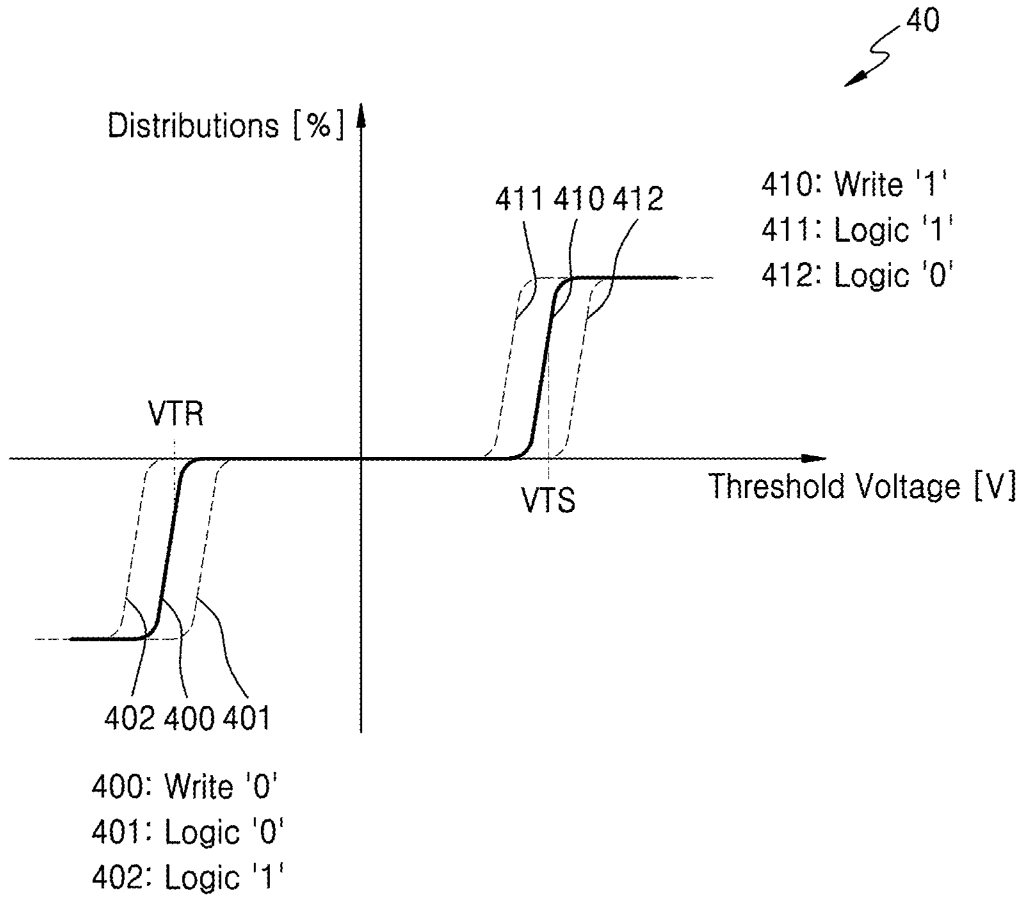
FIG. 4 is a diagram showing characteristics of the memory cell of FIG. 3 according to example embodiments.

FIG. 1 is a diagram conceptually showing a memory device according to example embodiments. FIG. 2 shows the configuration of a memory cell array 110 of FIG. 1 according to example embodiments. FIG. 3 is a diagram showing a structure of a memory cell 10 of FIG. 1 according to example embodiments. FIG. 4 is a diagram showing characteristics of the memory cell 10 of FIG. 3 according to example embodiments. For convenience of understanding, terms such as top surface/bottom surface, top/bottom, above/below, etc. are used based on directions shown in the drawings referred to. Accordingly, even the same surface may be referred to as a top surface or a bottom surface according to the directions shown in the drawings.

Referring to FIGS. 1 and 2, a memory device 100 may include the memory cell array 110, a first access circuit 120, a second access circuit 130, a sense circuit 140, and a control circuit 150. According to example embodiments of the inventive concept, the memory device 100 may be a phase change RAM (PRAM) including a plurality of memory cells 10 (sometimes referred to as selector only memories (SOMs)) consisting of Ovonic threshold switching devices, and, hereinafter, a "memory device" refers to a PRAM. FIG. 1 shows the memory device 100 implemented as a PRAM. It should be noted that the PRAM configuration shown in FIG. 1 is provided as an example and is not necessarily an actual PRAM configuration. Also, the example PRAM configuration shown in FIG. 1 does not represent or imply limitations on the inventive concept.

The memory cell array 110 may include the plurality of memory cells 10 that may be programmed by applying a voltage to the plurality of memory cells 10. The plurality of memory cells 10 may be arranged at regions where a plurality of first signal lines and a plurality of second signal lines intersect each other. According to an embodiment, a plurality of first signal lines may be a plurality of bit lines BL, and a plurality of second signal lines may be a plurality of word lines WL. According to another embodiment, the plurality of first signal lines may be a plurality of word lines WL, and the plurality of second signal lines may be a plurality of bit lines BL. For convenience of explanation, a first signal line is referred to as a bit line BL, and the term 'first signal line' and the term 'bit line BL' may be used interchangeably. A second signal line is referred to as a word line WL, and the term 'second signal line' and the term 'word line WL' may be used interchangeably.

As shown in FIG. 2, the memory cell array 110 may include word lines WL1 and WL2 extending in a first direction (X direction) and spaced apart from each other in a second direction (Y direction) perpendicular to the first direction (X direction). The memory cell array 110 may include bit lines BL1, BL2, BL3, and BL4 extending in the second direction (Y direction) and spaced apart from one another in the first direction (X direction). The bit lines BL1, BL2, BL3, and BL4 may be spaced apart from the word lines WL1 and WL2 in a third direction (Z direction). Although some elements included in FIG. 2 (e.g., BL and WL) are labeled with numerical notations, it will be understood that other corresponding elements are identical or similar to the BL and the WL in an effort to increase the visibility and clarity of the features described in the drawings below even when the other corresponding elements are not labeled.

According to some embodiments, the memory cell array 110 may include a first array of the memory cells 10 connected to the bit lines BL1, BL2, BL3, and BL4 and the word lines WL1 and WL2. However, it is merely an example to help understanding and is not intended to limit the inventive concept. The memory cell array 110 may include a second array of memory cells above the first array. When the memory cell array 110 includes multiple layers, the memory cell array 110 may be a 3-dimensional memory array.

As shown in FIG. 3, the memory cell 10 may be electrically connected to the bit line BL and the word line WL. The memory cell 10 may include a first electrode 11 in contact with the bit line BL, a second electrode 12 in contact with the word line WL, and a selector/storage material 13 between the first electrode 11 and the second electrode 12. The first electrode 11 and the second electrode 12 may each include aluminum (Al), molybdenum (Mo), tungsten (W), titanium (Ti), platinum (Pt), chromium (Cr), silicon (Si), a metal nitride thereof, or a metal oxide thereof. A material constituting the first electrode 11 of the memory cell 10 and a material constituting the second electrode 12 of the memory cell 10 may be identical to or different from each other. Also, the first electrode 11 or the second electrode 12 may each have a stacked structure of different materials from among the above-stated materials.

According to some embodiments, the first electrode 11 and the second electrode 12 may each include W, Ti, Ta, Al, Cu, C, CN, TiN, TiAlN, TiSiN, TiCN, TiCSiN, WN, CoSiN, WSiN, TaN, TaCN, TaSiN, TiO, or a combination thereof.

The selector/storage material 13 of the memory cell 10 may include a chalcogenide material having OTS characteristics. For example, the selector/storage material 13 may include an amorphous chalcogenide-based semiconductor material including at least one element selected from among antimony (Sb), bismuth (Bi), arsenic (As), germanium (Ge), silicon (Si), tin (Sn), carbon (C), etc., at least one element selected from among gallium (Ga), aluminum (Al), indium (In), etc., nitrogen (N), and tellurium (Te). An amorphous chalcogenide-based semiconductor material is an excellent conductive phase change material and may implement OTS characteristics.

According to some embodiments, selector/storage material 13 may be formed in a single layer film or a multiple layer film including materials selected from among binary materials such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb, ternary materials such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, quaternary materials such as GeSbTeS, BiSbTeSe, AgInSbTe, GeSbSeTe, GeSnSbTe, SiGeS bTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeln, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS, and quinary materials such as InSbTeAsSe, GeScSbSeTe, GeSbSeTeS, GeScSbSeS, GeScSbTeS, GeScSeTeS, GeScSbSeP, GeScSbTeP, Ge SbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSb SeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn, etc.

According to some embodiments, the selector/storage material 13 may include a material selected from among the materials exemplified above as materials constituting the selector/storage material 13, and at least one additional element selected from among B, C, N, O, P, Cd, W, Ti, Hf, and Zr.

FIGS. 3 and 4 shows a graph 40 showing a current according to a voltage applied between the first electrode 11 and the second electrode 12 with respect to the memory cell 10. In the memory cell 10, cell data may be programmed (or written) to or read from the selector/storage material 13 according to the magnitude and the polarity of a voltage applied between the first electrode 11 and the second electrode 12. The x-axis of graphs 400 and 410 of the graph 40 represents a programming voltage applied to the memory cell 10, and the y-axis of the graphs 400 and 410 of the graph 40 represents a current flowing through the memory cell 10. The x-axis of graphs 401, 402, 411, and 412 of the graph 40 represents a threshold voltage of the memory cell 10, and the y-axis of the graphs 401, 402, 411, and 412 of the graph 40 represents distributions of threshold voltages.

The graph 40 shows the graph 410 in which a cell current rapidly increases in a non-linear manner at a particular voltage VTS of a positive (+) programming voltage and the graph 400 in which a cell current rapidly increases in a non-linear manner at a particular voltage VTR of a negative (−) programming voltage.

The graph 40 shows the graph 411 which represents the switching characteristics to a logic "1" state, and the graph 412 which represents the switching characteristics to a logic "0" state. The graph 40 shows the graph 401 which represents the switching characteristics to a logic "0" state, and the graph 402 which represents the switching characteristics to a logic "1" state. Therefore, the memory cell 10 may perform a bidirectional switching memory function in which a change in a voltage applied between the first electrode 11 and the second electrode 12 of FIG. 3 is expressed as a current.

Hereinafter, for convenience of explanation, a positive programming voltage is referred to as a voltage for writing a logic "1" into the memory cell 10, and a negative programming voltage is referred to as a voltage for writing logic "0" into the memory cell 10. On the contrary, according to another embodiment, a negative programming voltage may be referred to as a voltage for writing logic "1" into memory cell 10, and a positive programming voltage may be referred to as a voltage for writing logic "O" into memory cell 10.

Figure 5A:
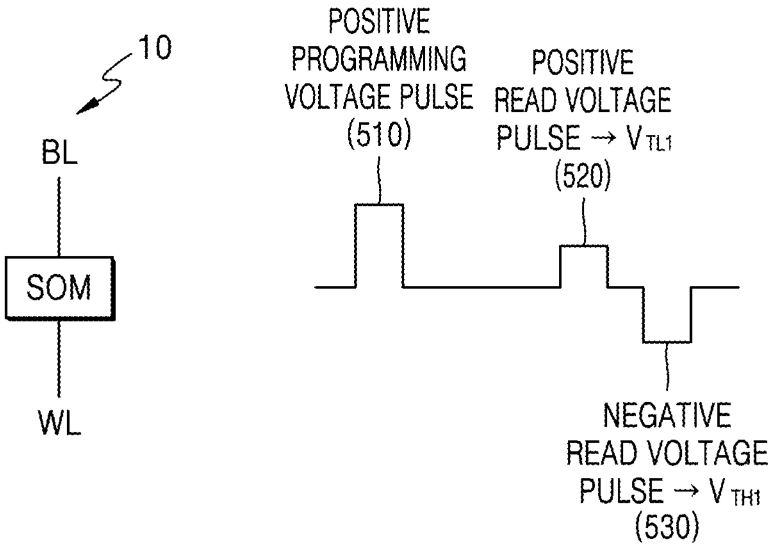
FIGS. 5A and 5B are diagrams illustrating a write operation and a read operation of the memory cell of FIG. 1 according to example embodiments.
Figure 5B:
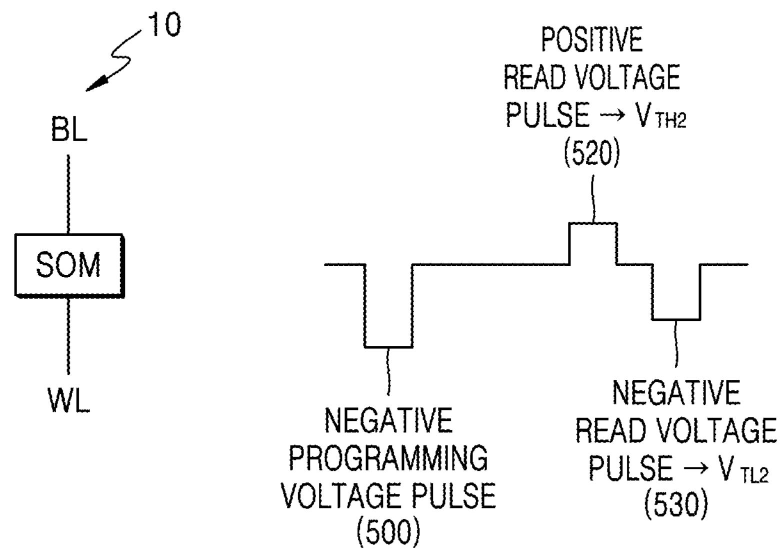

FIGS. 5A and 5B are diagrams illustrating a write operation and a read operation of the memory cell 10 of FIG. 1 according to example embodiments.

Referring to FIGS. 1, 3, and 5A, the first access circuit 120 and the second access circuit 130 may access the bit line BL and the word line WL to program or read cell data to or from the memory cell 10 connected to the bit line BL and the word line WL. Terms 'program' and 'write' may be used interchangeably to describe an operation of storing data in a memory cell. The first access circuit 120 and the second access circuit 130 may apply a positive programming voltage pulse 510 between the bit line BL and the word line WL to write logic "1" in the memory cell 10. The positive programming voltage pulse 510 may be set, such that a voltage applied to the bit line BL is greater than a voltage applied to the word line WL.

According to some embodiments, the positive programming voltage pulse 510 may constitute, for example, a positive voltage applied to the bit line BL and a negative voltage applied to the word line WL. For example, a positive voltage may be applied to the bit line BL and a ground voltage (e.g., VSS) may be applied to the word line WL. For example, when a positive voltage is applied to both the bit line BL and the word line WL, a voltage applied to the bit line BL may be greater than a voltage applied to the word line WL. For example, when a negative voltage is applied to both the bit line BL and the word line WL, a voltage applied to the bit line BL may be greater than a voltage applied to the word line WL.

The first access circuit 120 and the second access circuit 130 may apply a positive read voltage pulse 520 and a negative read voltage pulse 530 to the memory cell 10 to determine the logic state of cell data. When a read voltage pulse has the same polarity as a program voltage pulse, the memory cell 10 may exhibit a lower threshold voltage.

When a read voltage pulse has a different polarity from a program voltage pulse, the memory cell 10 may exhibit a higher threshold voltage.

The positive programming voltage pulse 510 followed by the positive read voltage pulse 520 results in a first low threshold voltage VTL1. It may be understood that the memory cell 10 has the threshold voltage distribution of the graph 411 in the graph 40 of FIG. 4. The positive programming voltage pulse 510 followed by the negative read voltage pulse 530 results in a first high threshold voltage VTH1. It may be understood that the memory cell 10 has the threshold voltage distribution of the graph 412 in the graph 40 of FIG. 4.

Referring to FIGS. 1, 3, and 5B, the first access circuit 120 and the second access circuit 130 may apply a negative programming voltage pulse 500 between the bit line BL and the word line WL to write logic "0" into the memory cell 10. The negative programming voltage pulse 500 may be set, such that a voltage applied to the bit line BL is smaller than a voltage applied to the word line WL.

According to some embodiments, the negative programming voltage pulse 500 may constitute, for example, a negative voltage applied to the bit line BL and a positive voltage applied to the word line WL. For example, a ground voltage VSS may be applied to the bit line BL, and a positive voltage may be applied to the word line WL. For example, when a positive voltage is applied to both the bit line BL and the word line WL, a voltage applied to the bit line BL may be smaller than a voltage applied to the word line WL. For example, when a negative voltage is applied to both the bit line BL and the word line WL, a voltage applied to the bit line BL may be smaller than a voltage applied to the word line WL.

The negative programming voltage pulse 500 followed by the positive read voltage pulse 520 results in a second high threshold voltage VTH2. It may be understood that the memory cell 10 has the threshold voltage distribution of the graph 402 in the graph 40 of FIG. 4. The negative programming voltage pulse 500 followed by the negative read voltage pulse 530 results in a second low threshold voltage VTL2. It may be understood that the memory cell 10 has the threshold voltage distribution of the graph 401 in the graph 40 of FIG. 4.

According to some embodiments, a programming voltage pulse and a read voltage pulse may be set as box-shaped pulses (e.g., rectangular-shaped pulses or square-shaped pulses) having the same duration. However, it is merely an example to help understanding and is not intended to limit the inventive concept. The first access circuit 120 and the second access circuit 130 may provide programming voltage pulses having pulses with various shapes, such as triangular pulses (e.g., ramped pulses) and/or trapezoidal pulses, and intervals that are sufficient to write desired data into the memory cell 10. According to embodiments, the first access circuit 120 and the second access circuit 130 may provide programming voltage pulses and read voltage pulses having different shapes from each other.

Referring back to FIG. 1, the first access circuit 120 and the second access circuit 130 may be connected to the sense circuit 140 to differentiate the logic state of cell data occurring in response to the positive read voltage pulse 520 and the negative read voltage pulse 530 applied to the memory cell 10. The sense circuit 140 may determine whether the threshold voltage of the memory cell 10 is lower or higher than a reference voltage, detect the threshold voltage of the memory cell 10, and determine the logic state of the memory cell 10.

The control circuit 150 may generate control signals that control operation timings and/or memory operations of the memory device 100. The control circuit 150 may provide control signals to circuits of the memory device 100. The control circuit 150 may control the memory device 100 to perform operations of writing cell data into the memory cell 10 and reading cell data from the memory cell 10 by using the control signals.

Figure 6:
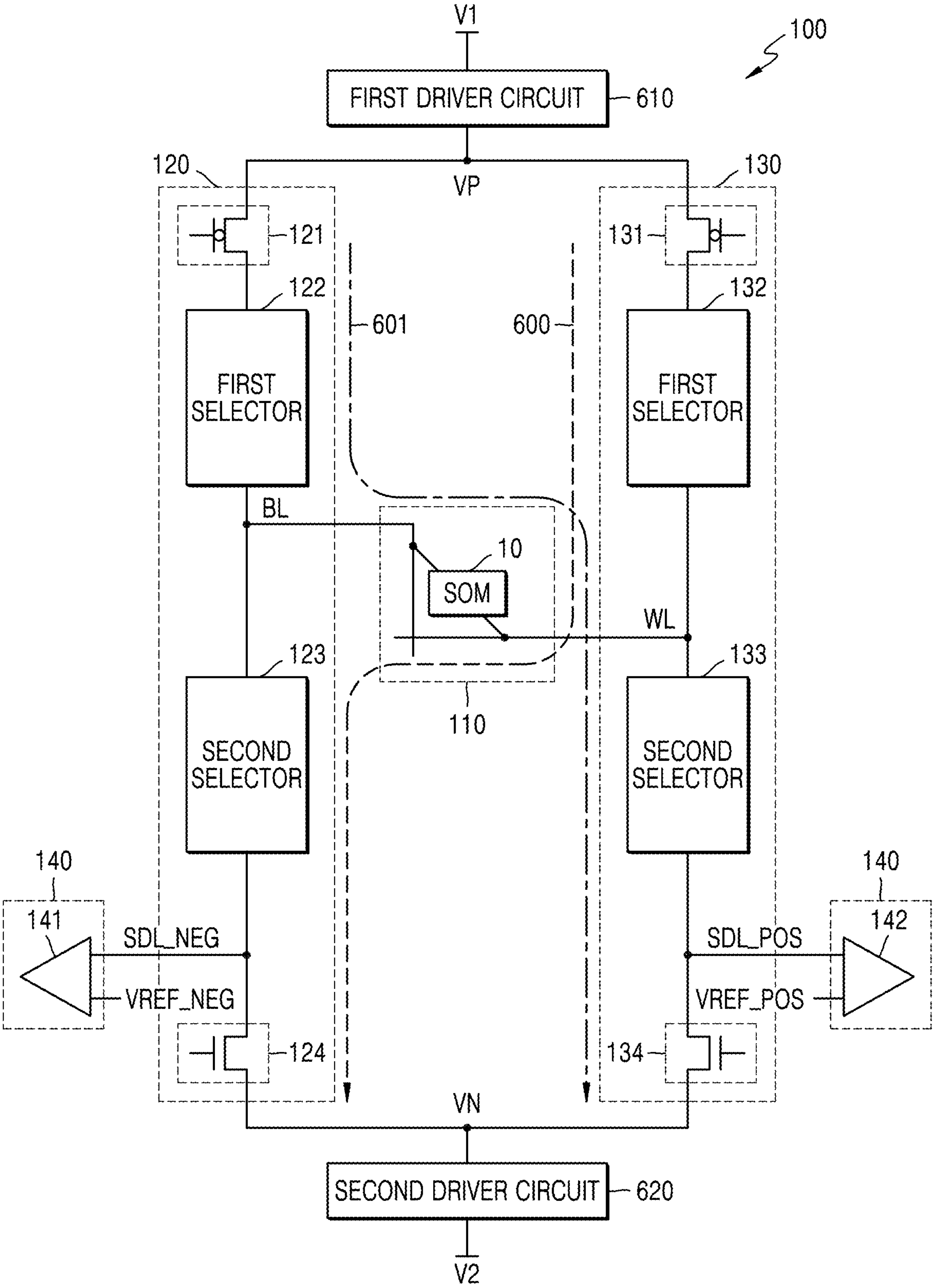
FIG. 6 is a diagram for describing a read operation the memory device, according to example embodiments.
Figure 7:
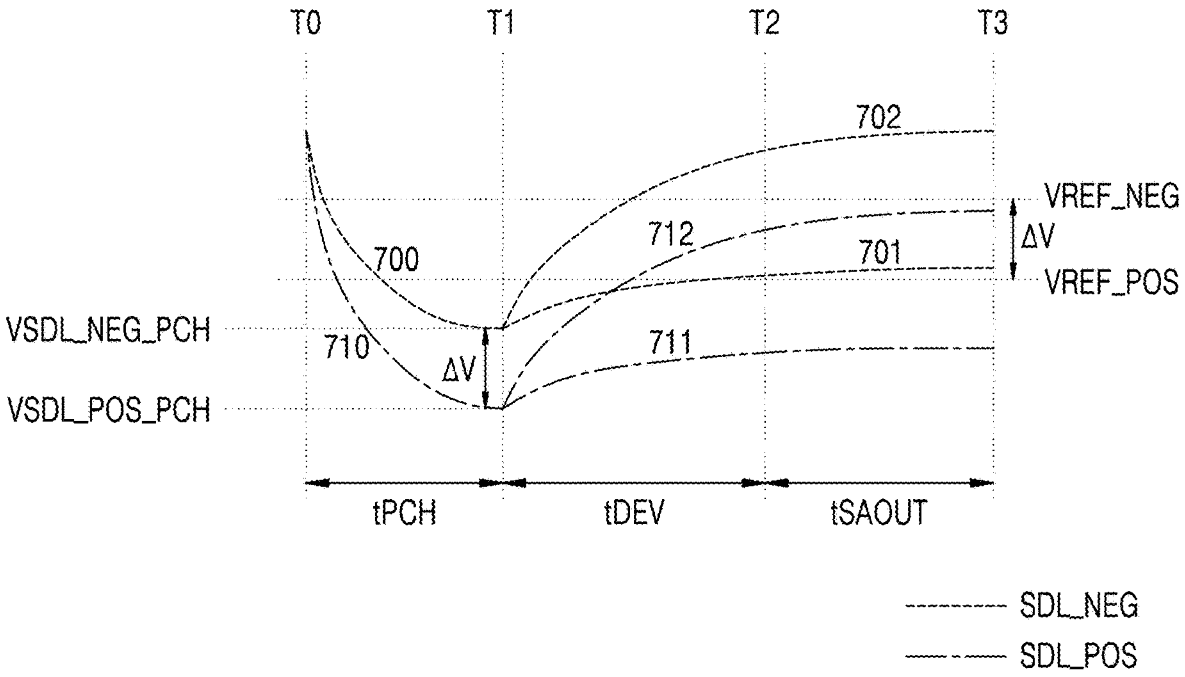
FIG. 7 shows a timing diagram according to timings of signals associated with a sense circuit of FIG. 6 according to example embodiments.

FIG. 6 is a diagram for describing a read operation the memory device 100, according to example embodiments. FIG. 7 shows a timing diagram according to timings of signals associated with the sense circuit 140 of FIG. 6 according to example embodiments. In timing diagrams shown below, the horizontal axis and the vertical axis represent time and voltage levels, respectively, and are not necessarily drawn to scale.

Referring to FIGS. 1, 5A, 5B, and 6, the memory device 100 may include a first driver circuit 610 and a second driver circuit 620 connected to the first access circuit 120 and the second access circuit 130. The first driver circuit 610 and the second driver circuit 620 may be controlled by the control circuit 150 and support operations in which the first access circuit 120 and the second access circuit 130 write/read cell data to/from the memory cell 10. Although FIG. 6 shows that the first driver circuit 610 and the second driver circuit 620 are components separate from the control circuit 150, the first driver circuit 610, the second driver circuit 620, and the control circuit 150 may be implemented as one inseparable component.

The first driver circuit 610 may selectively provide a first voltage V1 of the memory device 100 to the first access circuit 120 or the second access circuit 130 according to the control of the control circuit 150. The first voltage V1 may be generated by a voltage generating circuit included in the memory device 100 and set to have a positive voltage level. The voltage generating circuit may generate various internal voltages for driving circuits of the memory device 100. The first voltage V1 is shown as a single voltage, but may actually include a plurality of positive voltages. For example, the first voltage V1 may have a voltage level slightly higher than the level of a power voltage (e.g., VDD) of the memory device 100 or may have a voltage level equal to that of a high voltage (e.g., VPP) that is significantly higher than the power voltage level (e.g., VDD) of the memory device 100. The first driver circuit 610 may provide the first voltage V1 to a line of a positive voltage VP to which the first access circuit 120 and the second access circuit 130 are connected. The first driver circuit 610 may operate as a power supply circuit in relation to operations of the first access circuit 120 and the second access circuit 130.

The second driver circuit 620 may selectively provide a second voltage V2 of the memory device 100 to the first access circuit 120 or the second access circuit 130 according to the control of the control circuit 150. The second voltage V2 may be generated by a voltage generating circuit included in the memory device 100 and set to have a negative voltage level. According to embodiments, the second voltage V2 may be provided at various negative voltage levels. The second driver circuit 620 may provide the second voltage V2 to a line of a negative voltage VN to which the first access circuit 120 and the second access circuit 130 are connected. The second driver circuit 620 may operate as a power sink circuit in relation to operations of the first access circuit 120 and the second access circuit 130.

The first access circuit 120 may include a first switch 121, a first selector 122, a second selector 123, and a second switch 124. The first switch 121 and the first selector 122 are connected in series between the line of the positive voltage VP and the bit line BL, and, when the first switch 121 is turned on, the first voltage V1 of the line of the positive voltage VP may be provided to the bit line BL. The second selector 123 and the second switch 124 are connected in series between the bit line BL and the line of the negative voltage VN, and, when the second switch 124 is turned on, the second voltage V2 of the line of the negative voltage VN may be provided to the bit line BL. The first switch 121 and the second switch 124 may be controlled by the control circuit 150 to operate in opposite manners. For example, when the first switch 121 is turned on, the second switch 124 may be turned off. On the contrary, when the second switch 124 is turned on, the first switch 121 may be turned off.

The first selector 122 and the second selector 123 of the first access circuit 120 may select the bit line BL of the memory cell 10 corresponding to a column address from among a plurality of bit lines of the memory cell array 110. Column addresses are divided into column addresses of signals of a Most Significant Bit (MSB) group and column addresses of signals of a Least Significant Bit (LSB) group, and the bit line BL of the memory cell 10 may be selected by a bit line select signal generated by decoding column addresses of the MSB group and decoding column addresses of the LSB group.

The second access circuit 130 may include a first switch 131, a first selector 132, a second selector 133, and a second switch 134. The first switch 131 and the first selector 132 are connected in series between the line of the positive voltage VP and the word line WL, and, when the first switch 131 is turned on, the first voltage V1 of the line of the positive voltage VP may be provided to the word line WL. The second selector 133 and the second switch 134 are connected in series between the word line WL and the line of the negative voltage VN, and, when the second switch 134 is turned on, the second voltage V2 of the line of the negative voltage VN may be provided to the word line WL. The first switch 131 and the second switch 134 may be controlled by the control circuit 150 to operate in opposite manners. For example, when the first switch 131 is turned on, the second switch 134 may be turned off. On the contrary, when the second switch 134 is turned on, the first switch 131 may be turned off.

The first selector 132 and the second selector 133 of the second access circuit 130 may select the word line WL of the memory cell 10 corresponding to a row address from among a plurality of word lines of the memory cell array 110. Row addresses are divided into row addresses of signals of the MSB group and row addresses of signals of the LSB group, and the word line WL of the memory cell 10 may be selected by a word line select signal generated by decoding row addresses of the MSB group and decoding row addresses of the LSB group.

A connection node between the second selector 123 and the second switch 124 of the first access circuit 120 may be connected to the sense circuit 140 as a first sensing node SDL_NEG. A connection node between the second selector 133 and the second switch 134 of the second access circuit 130 may be connected to the sense circuit 140 as a second sensing node SDL_POS. The sense circuit 140 may include a first comparator 141 that compares a voltage level of a first reference voltage VREF_NEG with a voltage level of the first sensing node SDL_NEG and a second comparator 142 that compares a voltage level of a second reference voltage VREF_POS with a voltage level of the second sensing node SDL_POS.

According to some embodiments, the memory device 100 may program the memory cell 10 to logic "1" by using a first path 601 including the first driver circuit 610, the first switch 121 and the first selector 122 of the first access circuit 120, the bit line BL, the memory cell 10, the word line WL, the second selector 133 and the second switch 134 of the second access circuit 130, and the second driver circuit 620. This means that the positive programming voltage pulse 510 between the bit line BL and the word line WL described with reference to FIG. 5A is applied through the first path 601.

According to some embodiments, the memory device 100 may program the memory cell 10 to logic "0" by using a second path 600 including the first driver circuit 610, the first switch 131 and the first selector 132 of the second access circuit 130, the word line WL, the memory cell 10, the bit line BL, the second selector 123 and the second switch 124 of the first access circuit 120, and the second driver circuit 620. This means that the negative programming voltage pulse 500 between the bit line BL and the word line WL described with reference to FIG. 5B is applied through the second path 600.

According to some embodiments, to read cell data of the memory cell 10, the memory device 100 may apply the positive read voltage pulse 520 between the bit line BL and the word line WL described above with reference to FIGS. 5A and 5B by using the first path 601. The memory device 100 may apply the negative read voltage pulse 530 between the bit line BL and the word line WL described with reference to FIGS. 5A and 5B by using the second path 600.

Referring to FIGS. 5A, 6, and 7, the sense circuit 140 may determine the logic state of the memory cell 10, which is programmed according to a programming voltage pulse, by using read voltage pulses. It is assumed that the memory cell 10 is programmed to a logic "1" state by the positive programming voltage pulse 510. It may be seen that a voltage level 712 of the second sensing node SDL_POS is higher than the second reference voltage VREF_POS by the positive read voltage pulse 520 subsequent to the positive programming voltage pulse 510 and a voltage level 701 of the first sensing node SDL_NEG is lower than the first reference voltage VREF_NEG by the negative read voltage pulse 530 subsequent to the positive programming voltage pulse 510.

During a pre-charge period tPCH from a time point T0 to a time point T1, the sense circuit 140 may pre-charge the first sensing node SDL_NEG and the second sensing node SDL_POS. It is assumed that a voltage level 700 of the first sensing node SDL_NEG is higher than a voltage level 710 of the second sensing node SDL_POS.

During a development period tDEV from the time point T1 to a time point T2, the voltage level 700 of the first sensing node SDL_NEG is developed to voltage levels 701 and 702 according to the logic state of the memory cell 10 and the read voltage pulse, and the voltage level 710 of the second sensing node SDL_POS may also be developed to voltage levels 711 and 712 according to the logic state of the memory cell 10 and the read voltage pulse.

During a sensing period tSAOUT from the time point T2 to a time point T3, the sense circuit 140 may output a result of comparing the voltage levels 701 and 702 of the first sensing node SDL_NEG with the voltage level of the first reference voltage VREF_NEG and output a result of comparing the voltage levels 711 and 712 of the second sensing node SDL_POS with the voltage level of the second reference voltage VREF_POS.

In the pre-charge period tPCH, the first sensing node SDL_NEG may be pre-charged to a voltage level of a first pre-charge voltage VSDL_NEG_PCH, and the second sensing node SDL_POS may be pre-charged to a voltage level of a second pre-charge voltage VSDL_POS_PCH. For example, the voltage level of each of the first pre-charge voltage VSDL_NEG_PCH and the second pre-charge voltage VSDL_POS_PCH may be a negative voltage. A voltage difference ΔV between the first pre-charge voltage VSDL_NEG_PCH and the second pre-charge voltage VSDL_POS_PCH may appear when the load on the bit line BL connected to the memory cell 10 in the memory cell array 110 and the load on the word line WL connected to the memory cell 10 in the memory cell array 110 is connected are different. Line load may include line resistance and/or line capacitance resulting from the length and/or width of a line, the number of memory cells connected to the line, etc. In the present embodiment, the voltage difference ΔV that appears when the load on the bit line BL is greater than the load on the word line (WL) is described. According to another embodiment, a pre-charge voltage difference may appear between the first sensing node SDL_NEG and the second sensing node SDL_POS even when the load on the word line WL is greater than the load on the bit line BL.

The voltage difference ΔV between the first sensing node SDL_NEG and the second sensing node SDL_POS may be interpreted as an offset voltage between the first sensing node SDL_NEG and the second sensing node SDL_POS according to the load on the bit line BL. In consideration of the offset voltage, the sense circuit 140 may be designed, such that a voltage difference ΔV as much as the offset voltage appears between the first reference voltage VREF_NEG and the second reference voltage VREF_POS, which are respectively compared with voltage levels of the first sensing node SDL_NEG and the second sensing node SDL_POS. In other words, to read the memory cell 10, two reference voltages VREF_NEG and VREF_POS are needed in consideration of the offset voltage between the first sensing node SDL_NEG and the second sensing node SDL_POS, and two comparing circuits 141 and 142 respectively connected to each of the reference voltages VREF_NEG and VREF_POS are needed. In other words, the sense circuit 140 has asymmetry in which the comparing circuits 141 and 142 sense the memory cell 10 based on two different reference voltages VREF_NEG and VREF_POS, respectively. The asymmetry of the sense circuit 140 may cause bidirectional sensing mismatch for the memory cell 10 and reduce sensing margin. Therefore, the sensing margin of the sense circuit 140 may be reduced, thereby deteriorating accuracy and performance of the memory device 100.

Before sensing the memory cell 10, when the offset voltage difference between the first sensing node SDL_NEG and the second sensing node SDL_POS may be compensated in common for the first sensing node SDL_NEG and the second sensing node SDL_POS, the asymmetry of the sense circuit 140 may be eliminated. Also, when the first sensing node SDL_NEG and the second sensing node SDL_POS are combined with each other by the sense circuit 140 and the offset voltage difference is eliminated by combined first and second sensing nodes SDL_NEG and SDL_POS, the voltage level of the combined first and second sensing nodes SDL_NEG and SDL_POS may be sensed based on a single reference voltage (e.g., VREF of FIG. 8). This means that sensing accuracy may be improved because the sense circuit 140 senses the memory cell 10 by using one comparing circuit, and the area occupied by the sense circuit 140 may be reduced due to the reduced number of comparing circuits. Therefore, the chip size of the memory device 100 is reduced and the sensing accuracy of the sense circuit 140 is increased, and thus the operating performance of the memory device 100 may be improved.

Hereinafter, configurations and operations of the sense circuit 140 will be described in detail with reference to various embodiments.

Figure 8:
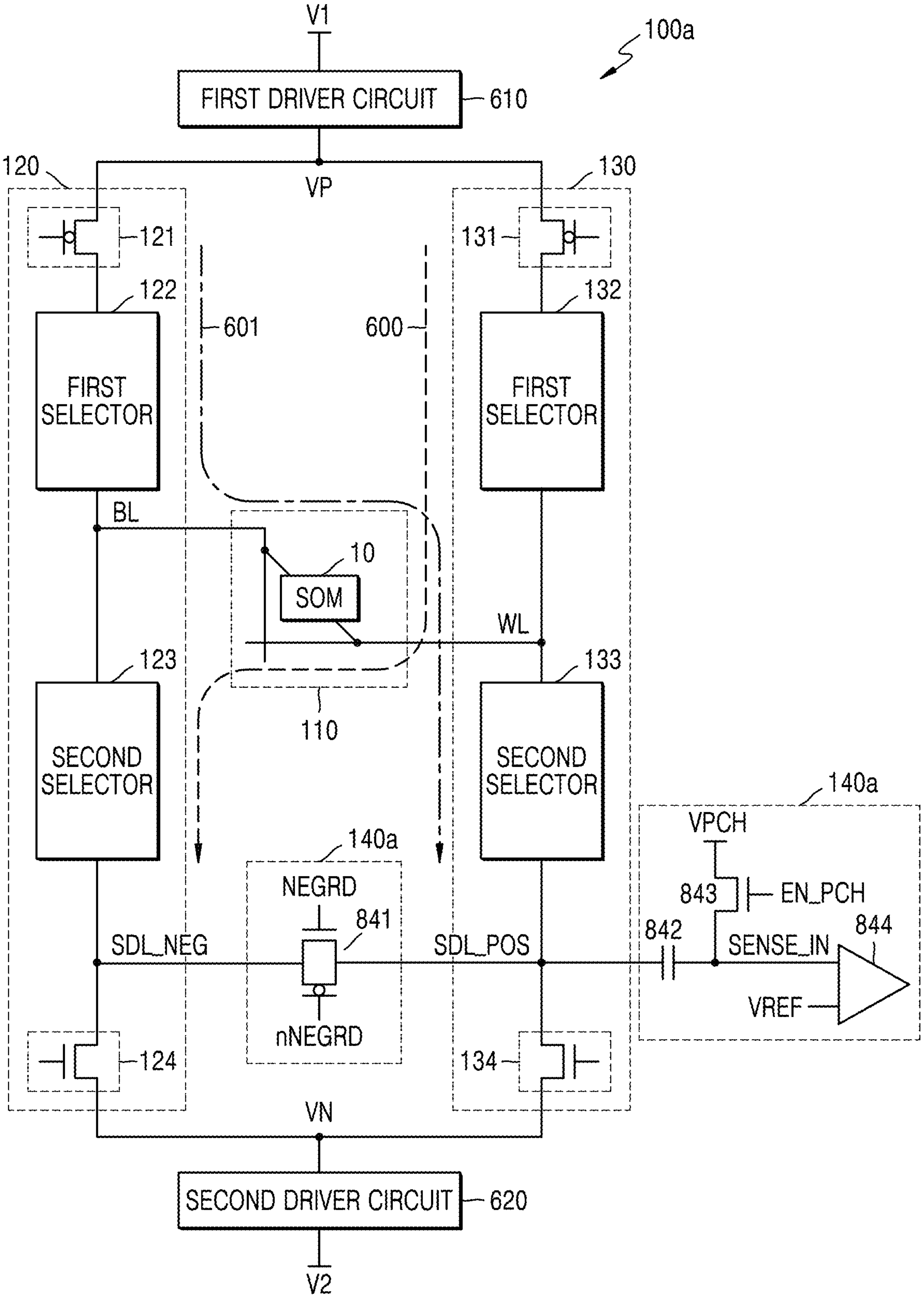
FIG. 8 is a diagram illustrating a memory device including a sense circuit, according to example embodiments.
Figure 9:
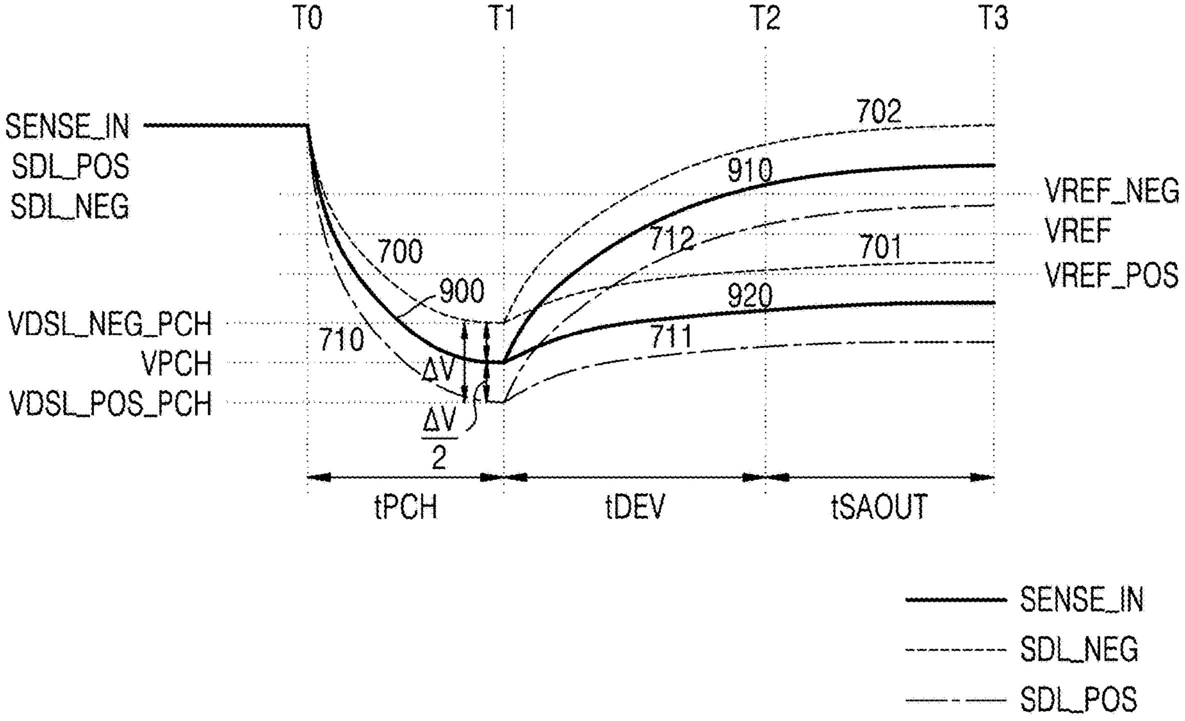
FIG. 9 shows a timing diagram according to timings of signals associated with the sense circuit of FIG. 8 according to example embodiments.

FIG. 8 is a diagram illustrating a memory device 100*a* including a sense circuit 140*a*, according to example embodiments. FIG. 9 shows a timing diagram according to timings of signals associated with the sense circuit 140*a* of FIG. 8 according to example embodiments. In FIG. 8, the memory cell array 110, the first access circuit 120, the second access circuit 130, the first driver circuit 610, and the second driver circuit 620 of the memory device 100*a* are identical to those described with reference to FIG. 6, and thus descriptions identical to those given above with reference to are omitted. Hereinafter, subscripts attached to the same reference numerals in different drawings (e.g., a in 100*a* and a in 140*a*) are used to distinguish a plurality of circuits that perform similar or identical functions.

Referring to FIGS. 1 and 8, the memory device 100*a* may include the sense circuit 140*a* connected to the first sensing node SDL_NEG and the second sensing node SDL_POS. The sense circuit 140*a* may include a switch 841 connected between the first sensing node SDL_NEG and the second sensing node SDL_POS, a capacitor 842 connected between the second sensing node SDL_POS and a sensing input node SENSE_IN, a pre-charger 843 connected between the line of a pre-charge voltage VPCH and the sensing input node SENSE_IN, and a comparing circuit 844 that compares a voltage level of the sensing input node SENSE_IN with a voltage level of the reference voltage VREF.

In the sense circuit 140*a*, when the switch 841 is turned on, the first sensing node SDL_NEG and the second sensing node SDL_POS are combined with each other, and the voltage of the combined first and second sensing nodes SDL_NEG and SDL_POS may be coupled through the capacitor 842 and transmitted to the sensing input node SENSE_IN. For example, the first sensing node SDL_NEG and the second sensing node SDL_POS are electrically connected to each other by the switch 841 turned on. As shown in FIG. 9, before the switch 841 is turned on, a voltage level 710 of the second sensing node SDL_POS is lower than a voltage level 700 of the first sensing node SDL_NEG as much as the offset voltage difference (e.g., ΔV of FIG. 7). When the switch 841 is turned on, the voltage level of the second sensing node SDL_POS may increase by half the offset voltage difference by the combined first and second sensing nodes SDL_NEG and SDL_POS, and the voltage level of the first sensing node SDL_NEG may decrease by half the offset voltage difference. Therefore, a voltage level 900 of the sensing input node SENSE_IN coupled through the capacitor 842 may be expressed as a graph of the voltage level 920 of the first sensing node SDL_NEG and a graph of the voltage level 910 of the second sensing node SDL_POS.

According to some embodiments, the switch 841 may be implemented as a transmission gate that responds to a first read signal NEGRD and a second read signal nNEGRD. The first read signal NEGRD and the second read signal nNEGRD may have logic levels opposite to each other, the first read signal NEGRD may be connected to a PMOS transistor of the transmission gate, and the second read signal nNEGRD may be connected to an NMOS transistor of the transmission gate.

The pre-charger 843 may pre-charge the sensing input node SENSE_IN to a voltage level of the pre-charge voltage VPCH based on a pre-charge control signal EN_PCH. The pre-charger 843 may be implemented as a transistor that is turned on in response to the pre-charge control signal EN_PCH. The pre-charge control signal EN_PCH may be provided from the control circuit 150. The control circuit 150 may turn on the switch 841 in response to the first read signal NEGRD and the second read signal nNEGRD and then activate the pre-charge control signal EN_PCH.

The comparing circuit 844 may compare the voltage level of the sensing input node SENSE_IN with the voltage level of the reference voltage VREF and output a signal indicating the logic state of the memory cell 10. The voltage level of the reference voltage VREF may be set to an intermediate level between the voltage level of the first reference voltage VREF_NEG and the voltage level of the second reference voltage VREF_POS. When the voltage level of the sensing input node SENSE_IN is higher than the voltage level of the reference voltage VREF, the logic state of the memory cell 10 may be determined as a logic "1" state with a low threshold voltage. When the voltage level of the sensing input node SENSE_IN is lower than the voltage level of reference voltage VREF, the logic state of the memory cell 10 may be determined as a logic "O" state with a high threshold voltage.

Referring to FIG. 9, during the pre-charge period tPCH from the time point T0 to the time point T1, the sense circuit 140*a* may pre-charge the sensing input node SENSE_IN to the voltage level of the pre-charge voltage VPCH. During the development period tDEV from the time point T1 to the time point T2, a voltage level 900 of the sensing input node SENSE_IN may be developed to voltage levels 910 and 920 according to the logic state of the memory cell 10. It may be seen that the graph of a voltage level 910 of the sensing input node SENSE_IN has an intermediate level between the voltage level 702 of the first sensing node SDL_NEG and the voltage level 712 of the second sensing node SDL_POS described with reference to FIG. 7, and the graph of the voltage level 920 of the sensing input node SENSE_IN has an intermediate level between the voltage level 701 of the first sensing node SDL_NEG and the voltage level 711 of the second sensing node SDL_POS described with reference to FIG. 7. During the sensing period tSAOUT from the time point T2 to the time point T3, the sense circuit 140*a* may output a result of comparing the voltage levels 910 and 920 of the sensing input node SENSE_IN with the voltage level of the reference voltage VREF.

Figure 10:
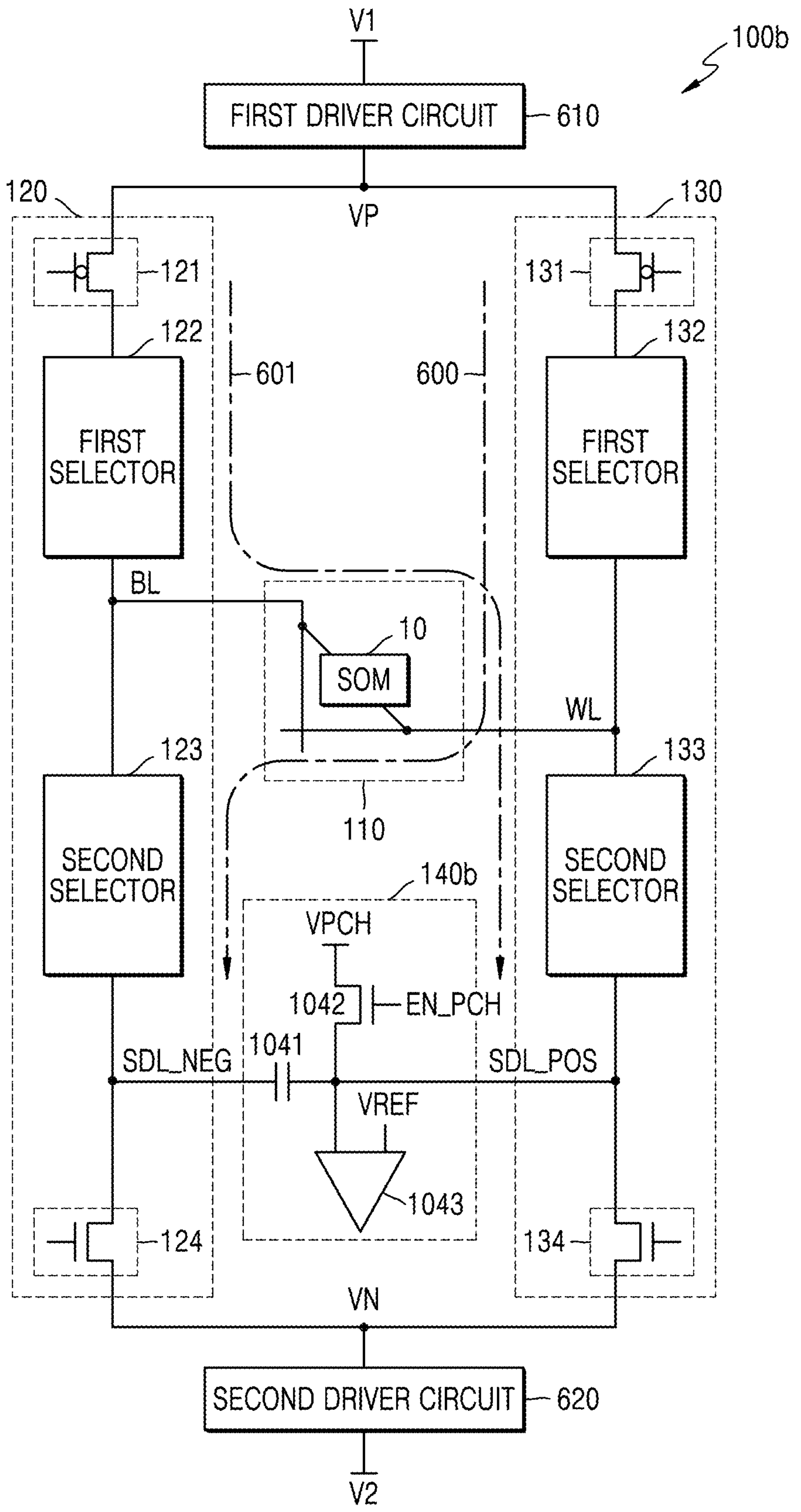
FIGS. 10 and 11 are diagrams illustrating memory devices including a sense circuit, according to example embodiments.
Figure 11:
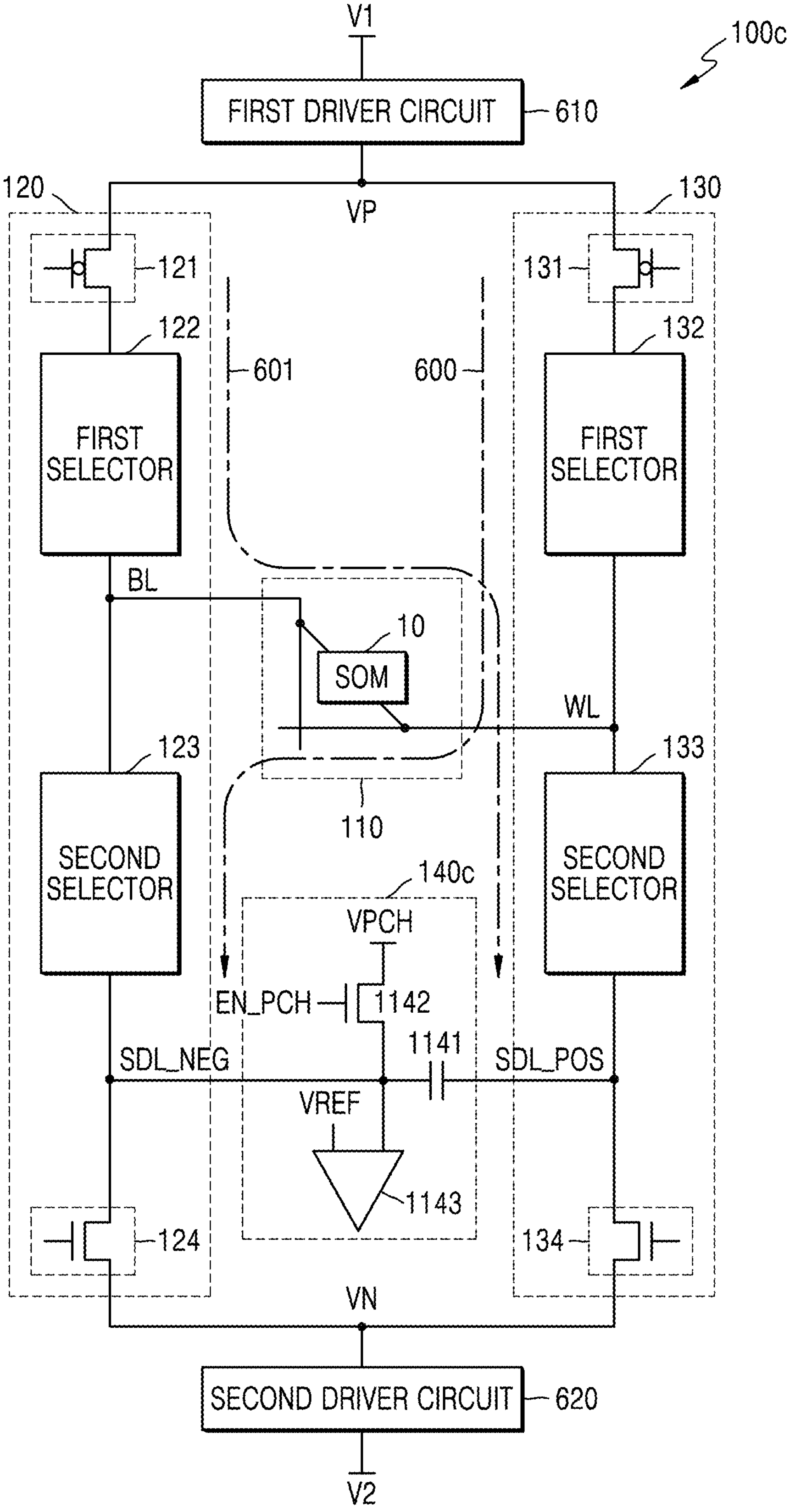

FIGS. 10 and 11 are diagrams illustrating memory devices including a sense circuit, according to example embodiments. In FIGS. 10 and 11, the memory cell array 110, the first access circuit 120, the second access circuit 130, the first driver circuit 610, and the second driver circuit 620 of each of memory devices 100*b* and 100*c* are identical to those described with reference to FIG. 6, and thus descriptions identical to those given above with reference to are omitted.

Referring to FIG. 10, a memory device 100*b* may include a sense circuit 140*b* connected to the first sensing node SDL_NEG and the second sensing node SDL_POS. The sense circuit 140*b* may include a capacitor 1041 connected between the first sensing node SDL_NEG and the second sensing node SDL_POS, a pre-charger 1042 connected between the line of the pre-charge voltage VPCH and the second sensing node SDL_POS, and a comparing circuit 1043 that compares the voltage level of the second sensing node SDL_POS with the voltage level of the reference voltage VREF. The voltage of the first sensing node SDL_NEG may be coupled through the capacitor 1041 and transmitted to the second sensing node SDL_POS. The pre-charger 1042 may pre-charge the second sensing node SDL_POS to the voltage level of the pre-charge voltage VPCH in response to the pre-charge control signal EN_PCH provided from the control circuit 150. The comparing circuit 1043 may compare the voltage level of the second sensing node SDL_POS with the voltage level of the reference voltage VREF and output a signal indicating the logic state of the memory cell 10.

Referring to FIG. 11, a memory device 100*c* may include a sense circuit 140*c* connected to the first sensing node SDL_NEG and the second sensing node SDL_POS. The sense circuit 140*c* may include a capacitor 1141 connected between the first sensing node SDL_NEG and the second sensing node SDL_POS, a pre-charger 1142 connected between the line of the pre-charge voltage VPCH and the first sensing node SDL_NEG, and a comparing circuit 1143 that compares the voltage level of the first sensing node SDL_NEG with the voltage level of the reference voltage VREF. The voltage of the second sensing node SDL_POS may be coupled through the capacitor 1141 and transmitted to the first sensing node SDL_NEG. The pre-charger 1142 may pre-charge the first sensing node SDL_NEG to the level of the pre-charge voltage VPCH in response to the pre-charge control signal EN_PCH provided from the control circuit 150. The comparing circuit 1143 may compare the voltage level of the first sensing node SDL_NEG with the voltage level of the reference voltage VREF and output a signal indicating the logic state of the memory cell 10.

Figure 12:
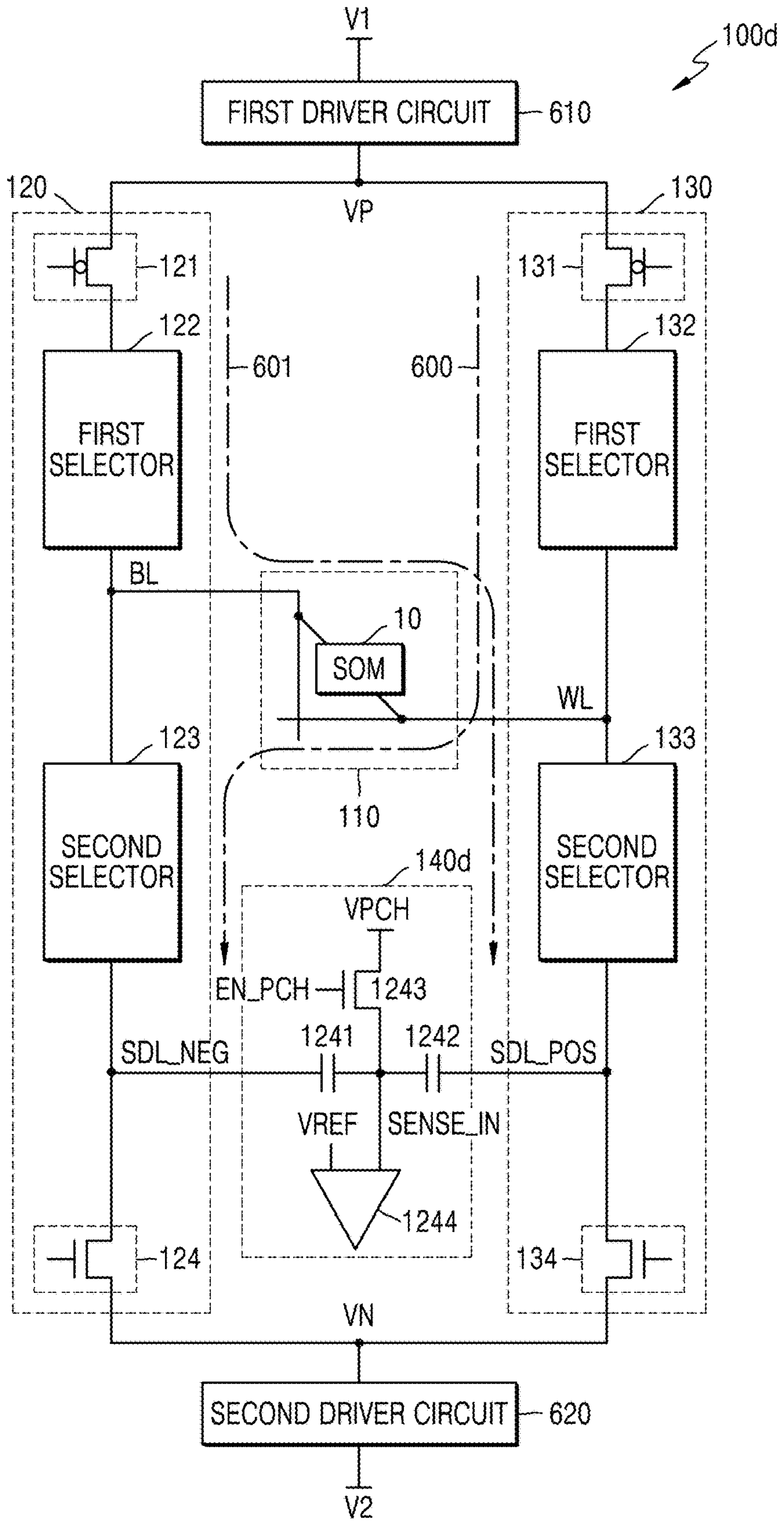
FIG. 12 is a diagram illustrating a memory device including a sense circuit, according to example embodiments.

FIG. 12 is a diagram illustrating a memory device including a sense circuit, according to example embodiments. In FIG. 12, the memory cell array 110, the first access circuit 120, the second access circuit 130, the first driver circuit 610, and the second driver circuit 620 of a memory device 100*d* are identical to those described with reference to FIG. 6, and thus descriptions identical to those given above with reference to are omitted.

Referring to FIG. 12, the memory device 100*d* may include a sense circuit 140*d* connected to the first sensing node SDL_NEG and the second sensing node SDL_POS. The sense circuit 140*d* includes a first capacitor 1241 and a second capacitor 1242 connected in series between the first sensing node SDL_NEG and the second sensing node SDL_POS, and a connection node between the first capacitor 1241 and the second capacitor 1242 becomes the sensing input node SENSE_IN. The sense circuit 140*d* may further include a pre-charger 1243 connected between the line of the pre-charge voltage VPCH and the sensing input node SENSE_IN and a comparing circuit 1244 that compares the voltage level of the sensing input node SENSE_IN with the voltage level of the reference voltage VREF.

The voltage of the first sensing node SDL_NEG may be coupled through the first capacitor 1241 and transmitted to the sensing input node SENSE_IN, and the voltage of the second sensing node SDL_POS may be coupled through the second capacitor 1242 and transmitted to the sensing input node SENSE_IN. The pre-charger 1243 may pre-charge the sensing input node SENSE_IN to the voltage level of the pre-charge voltage VPCH in response to the pre-charge control signal EN_PCH provided from the control circuit 150. The comparing circuit 1244 may compare the voltage level of the sensing input node SENSE_IN with the voltage level of the reference voltage VREF and output a signal indicating the logic state of the memory cell 10.

Figure 13:
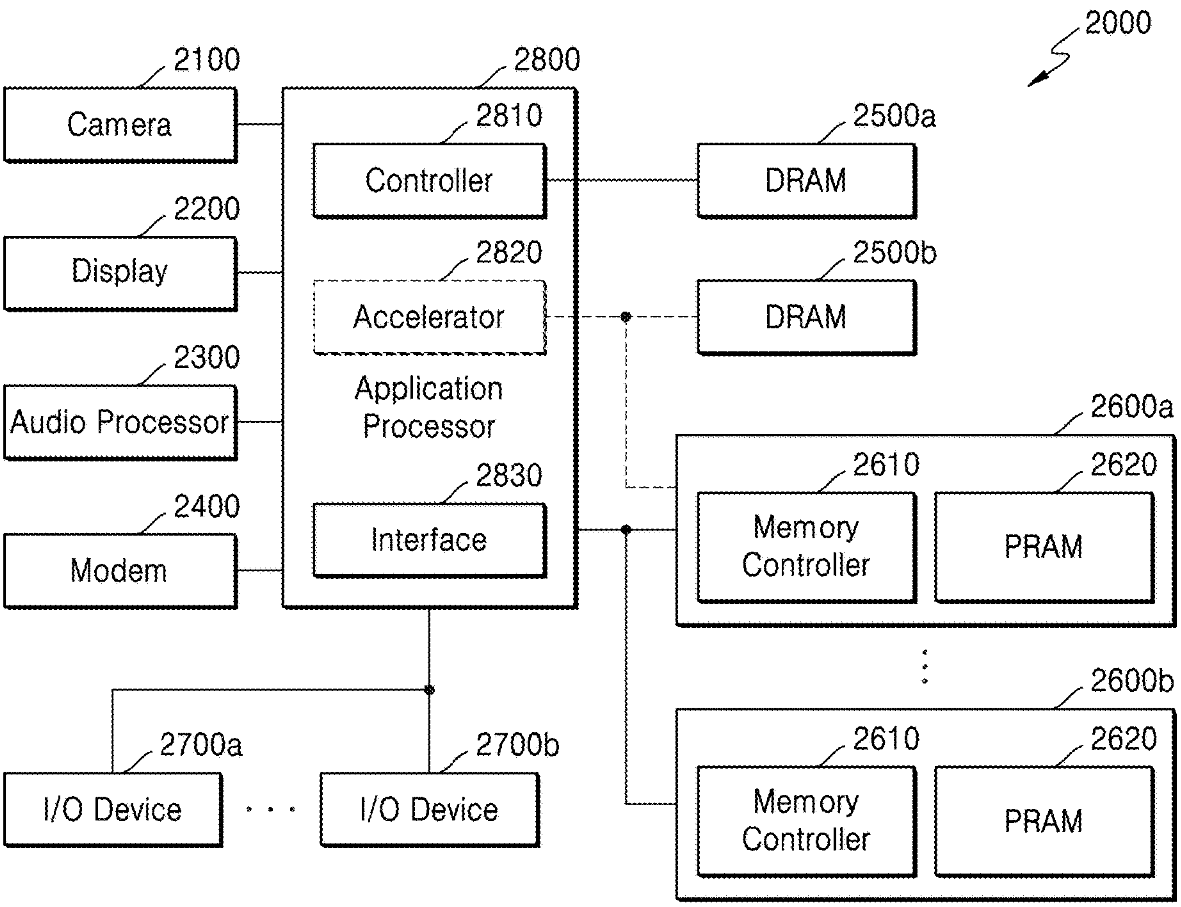
FIG. 13 is a block diagram of a system illustrating an electronic device including a memory device, according to example embodiments.

FIG. 13 is a block diagram of a system 2000 illustrating an electronic device including a memory device according to example embodiments;

Referring to FIG. 13, the system 2000 may include a camera 2100, a display 2200, an audio processor 2300, a modem 2400, DRAMs 2500*a* and 2500*b*, non-volatile memories 2600*a* and 2600*b*, I/O devices 2700*a* and 2700*b*, and an application processor (AP) 2800. The system 2000 may be implemented as a laptop computer, a mobile phone, a smartphone, a tablet PC, a wearable device, a healthcare device, or an Internet of Things (IoT) device. Also, the system 2000 may be implemented as a server or a PC.

The camera 2100 may capture a still image or a video according to a user's control and may store captured image/video data or transmit the captured image/video data to the display 2200. The audio processor 2300 may process audio data included in the non-volatile memories 2600*a* and 2600*b* or network content. The modem 2400 may transmit a modulated signal for wired/wireless data transmission/reception to a receiver and the modulated signal may be demodulated by the receiver to restore an original signal. The I/O devices 2700*a* and 2700*b* may include devices providing a digital input function and/or digital output function, e.g., a Universal Serial Bus (USB), a storage, a digital camera, a Secure Digital (SD) card, a Digital Versatile Disc (DVD), a network adapter, a touch screen, etc.

The AP 2800 may control the overall operation of the system 2000. The AP 2800 may include a control block 2810, an accelerator block or accelerator chip 2820, and an interface block 2830. The AP 2800 may control the display 2200, such that a part of content stored in the non-volatile memories 2600*a* and 2600*b* is displayed on the display 2200. When a user input is received through the I/O devices 2700*a* and 2700*b*, the AP 2800 may perform a control operation corresponding to the user input. The AP 2800 may include an accelerator block, which is a circuit dedicated for calculation of artificial intelligence (AI) data, or may include an accelerator chip 2820 separately from the AP 2800. The DRAM 2500*b* may be additionally provided in the accelerator block or the accelerator chip 2820. The accelerator block is a functional block that specializes in performing a particular function of the AP 2800 and may include a GPU, which is a functional block that specializes in processing graphic data, a neural processing unit (NPU), which is a block that specializes in AI calculation and inference, and a data processing unit (DPU), which is a block that specializes in data transmission.

The system 2000 may include a plurality of DRAMs 2500*a* and 2500*b*. The AP 2800 may set up a DRAM interface protocol and communicate with the DRAMs 2500*a* and 2500*b* to control the DRAMs 2500*a* and 2500*b* through commands complying with the Joint Electron Device Engineering Council (JEDEC) standard and mode register (MRS) setting or to use company-specific functions such as low voltage/high-speed/reliability and a cyclic redundancy check (CRC)/error correction code (ECC) function. For example, the AP 2800 may communicate with the DRAM 2500*a* through an interface complying with the JEDEC standards such as LPDDR4 and LPDDR5, and the accelerator block or the accelerator chip 2820 may set and use a new DRAM interface protocol to control the DRAM 2500*b* for an accelerator, which has a greater bandwidth than the DRAM 2500*a*.

Although FIG. 13 shows only the DRAMs 2500*a* and 2500*b*, the inventive concept is not limited thereto. As long as a bandwidth, a response speed, and voltage conditions of the AP 2800 or the accelerator chip 2820 are satisfied, any memory like a PRAM, an SRAM, an MRAM, an RRAM, an FRAM, or a Hybrid RAM may be used. The DRAMs 2500*a* and 2500*b* have relatively smaller latency and bandwidth than the I/O devices 2700*a* and 2700*b* or the non-volatile memories 2600*a* and 2600*b*. The DRAMs 2500*a* and 2500*b* are initialized when the system 2000 is powered on and the OS and application data are loaded thereto, and thus the DRAMs 2500*a* and 2500*b* may be used as temporary storages for the OS and the application data or may be used as execution spaces for various software code.

In the DRAMs 2500*a* and 2500*b*, four arithmetic operations (i.e., addition, subtraction, multiplication, and division), vector calculations, address calculations, or Fast Fourier Transform (FFT) calculations may be performed. Also, in the DRAMs 2500*a* and 2500*b*, a function for an operation used for an inference may be performed. Here, the inference may be performed in a deep learning algorithm using an artificial neural network. The deep learning algorithm may include a training operation for learning a model through various data and an inference operation for recognizing data with the trained model. According to an embodiment, an image captured by a user through the camera 2100 is signal-processed and stored in the DRAM 2500*b*, and the accelerator block or accelerator chip 2820 may perform AI data calculation for recognizing data using data stored in the DRAM 2500*b* and a function used for inference.

The system 2000 may include a plurality of storages or non-volatile memories 2600*a* and 2600*b* having a larger capacity than the DRAMs 2500*a* and 2500*b*. The accelerator block or accelerator chip 2820 may perform a training operation and an AI data calculation using the non-volatile memories 2600*a* and 2600*b*. According to an embodiment, each of the non-volatile memories 2600*a* and 2600*b* may include a memory controller 2610 and a memory device 2620, for example, PRAM and a training operation and an inference AI data calculation performed by the AP 2800 and/or the accelerator chip 2820 may be performed more efficiently by using an arithmetic unit included in the memory controller 2610. For example, the memory device 2620 may be a resistive memory (RRAM) device or MRAM device. The non-volatile memories 2600*a* and 2600*b* may store images captured through the camera 2100 or data transmitted through a data network. For example, the flash memories 2600*a* and 2600*b* may store Augmented Reality/Virtual Reality content, High Definition (HD) content, or Ultra High Definition (UHD) content.

In the system 2000, the non-volatile memories 2600*a* and 2600*b* may include the memory device described above with reference to FIGS. 1 to 4, 5A, 5B, and 6 to 12. The memory device may program a material film in an amorphous state (e.g., logic "0") or crystalline state (e.g., logic "1") between the first electrode and the second electrode of a memory cell by using positive program voltage pulses or negative program voltage pulses provided by access circuits. An access circuit may provide positive read voltage pulses and negative read voltage pulses between the first electrode and the second electrode, and the sense circuit may determine the logic state of a selected memory cell based on the electrical reactions of a first sensing node and a second sensing node connected to the selected memory cell with regard to the positive read voltage pulses and the negative read voltage pulses. The sense circuit may include a switch interconnecting the first sensing node and the second sensing node, a capacitor connected to the sensing input node, a pre-charger, and a comparing circuit. The sense circuit may include a capacitor connected between the first sensing node and the second sensing node, a pre-charger connected to the first sensing node on one side of the capacitor, and a comparing circuit. The sense circuit may include a capacitor connected between the first sensing node and the second sensing node, a pre-charger connected to the second sensing node on one side of the capacitor, and a comparing circuit. The sense circuit may include a first capacitor connected between the first sensing node and the sensing input node, a second capacitor connected between the second sensing node and the sensing input node, a capacitor connected to the sensing input node, a pre-charger, and a comparing circuit. Therefore, the memory device may improve the accuracy of a read operation and reduce the chip size.

While the inventive concept has been particularly shown and described with reference to embodiments thereof, it will be understood that various changes in form and details may be made therein without departing from the spirit and scope of the present invention as set forth in the following claims.

What is claimed is:

1. A memory device comprising:

a memory cell array including a plurality of memory cells, each of the plurality of memory cells including a material film, a first electrode on a first side of the material film, and a second electrode on a second side of the material film opposite to the first side, wherein a logic state of the material film is programmed based on whether the material film is in a crystalline state or an amorphous state;

an access circuit configured to apply a first voltage to a first electrode of a selected memory cell from among the plurality of memory cells and apply a second voltage to a second electrode of the selected memory cell; and a sense circuit configured to determine a logic state of the selected memory cell based on electrical reactions of a first sensing node and a second sensing node connected to the selected memory cell with regard to the first voltage and the second voltage, wherein the sense circuit comprises:

a switch configured to electrically connect the first sensing node to the second sensing node based on a read signal;

a capacitor connected between the second sensing node and a sensing input node;

a pre-charger configured to pre-charge the sensing input node with a pre-charge voltage based on a pre-charge control signal; and a comparing circuit configured to compare a voltage level of the sensing input node with a voltage level of a reference voltage and output a signal indicating the logic state of the selected memory cell.

2. The memory device of claim 1, wherein the access circuit is further configured to program the selected memory cell to logic “1” by using a positive programming voltage pulse that applies the first voltage having a first magnitude to the first electrode and applies the second voltage having a second magnitude smaller than the first magnitude to the second electrode.

3. The memory device of claim 2, wherein the access circuit is further configured to provide:

a positive read voltage pulse for applying the first voltage having a third magnitude to the first electrode and the second voltage having a fourth magnitude smaller than the third magnitude to the second electrode, and a negative read voltage pulse for applying the first voltage having a fifth magnitude to the first electrode and the second voltage having a sixth magnitude greater than the fifth magnitude to the second electrode, and wherein the first sensing node indicates a low threshold voltage due to the positive read voltage pulse, and the second sensing node indicates a high threshold voltage due to the negative read voltage pulse.

4. The memory device of claim 1, wherein the access circuit is further configured to program the selected memory cell to logic “0” by using a negative programming voltage pulse that applies the first voltage having a first magnitude to the first electrode and applies the second voltage having a second magnitude greater than the first magnitude to the second electrode.

5. The memory device of claim 4, wherein the access circuit is further configured to provide:

a positive read voltage pulse for applying the first voltage having a third magnitude to the first electrode and the second voltage having a fourth magnitude smaller than the third magnitude to the second electrode, and a negative read voltage pulse for applying the first voltage having a fifth magnitude to the first electrode and the second voltage having a sixth magnitude greater than the fifth magnitude to the second electrode, and wherein the first sensing node indicates a high threshold voltage due to the positive read voltage pulse, and the second sensing node indicates a low threshold voltage due to the negative read voltage pulse.

6. The memory device of claim 1, wherein the plurality of memory cells include phase change memory cells.

7. A memory device comprising:

a memory cell array including a plurality of memory cells, each of the plurality of memory cells including a material film, a first electrode on a first side of the material film, and a second electrode on a second side of the material film, wherein a logic state of the material film is programmed based on whether the material film is in a crystalline state or an amorphous state;

an access circuit configured to apply a first voltage to a first electrode of a selected memory cell from among the plurality of memory cells and apply a second voltage to a second electrode of the selected memory cell; and a sense circuit configured to determine a logic state of the selected memory cell based on electrical reactions of a first sensing node and a second sensing node connected to the selected memory cell with regard to the first voltage and the second voltage, wherein the sense circuit comprises:

a capacitor connected between the first sensing node and the second sensing node;

a pre-charger configured to pre-charge a first end of the capacitor to a voltage level of a pre-charge voltage; and a comparing circuit configured to compare a voltage level of the first end of the capacitor with a voltage level of a reference voltage and output a signal indicating the logic state of the selected memory cell.

8. The memory device of claim 7, wherein a second end of the capacitor is connected to the first sensing node.

9. The memory device of claim 7, wherein a second end of the capacitor is connected to the second sensing node.

10. The memory device of claim 7, wherein the access circuit is further configured to program the selected memory cell to logic “1” by using a positive programming voltage pulse that applies the first voltage having a first magnitude to the first electrode and applies the second voltage having a second magnitude smaller than the first magnitude to the second electrode.

11. The memory device of claim 10, wherein the access circuit is further configured to provide:

a positive read voltage pulse for applying the first voltage having a third magnitude to the first electrode and the second voltage having a fourth magnitude smaller than the third magnitude to the second electrode, and a negative read voltage pulse for applying the first voltage having a fifth magnitude to the first electrode and the second voltage having a sixth magnitude greater than the fifth magnitude to the second electrode, and wherein the first sensing node indicates a low threshold voltage due to the positive read voltage pulse, and the second sensing node indicates a high threshold voltage due to the negative read voltage pulse.

12. The memory device of claim 7, wherein the access circuit is further configured to program the selected memory cell to logic "0" by using a negative programming voltage pulse that applies the first voltage having a first magnitude to the first electrode and applies the second voltage having a second magnitude greater than the first magnitude to the second electrode.

13. The memory device of claim 12, wherein the access circuit is further configured to provide:

a positive read voltage pulse for applying the first voltage having a third magnitude to the first electrode and the second voltage having a fourth magnitude smaller than the third magnitude to the second electrode, and a negative read voltage pulse for applying the first voltage having a fifth magnitude to the first electrode and applying the second voltage having a sixth magnitude greater than the fifth magnitude to the second electrode, and wherein the first sensing node indicates a high threshold voltage due to the positive read voltage pulse, and the second sensing node indicates a low threshold voltage due to the negative read voltage pulse.

14. The memory device of claim 7, wherein the plurality of memory cells include phase change memory cells.

15. A memory device comprising:

a memory cell array including a plurality of memory cells, each of the plurality of memory cells including a material film, a first electrode on a first side of the material film, and a second electrode on a second side of the material film, wherein a logic state of the material film is programmed based on whether the material film is in a crystalline state or an amorphous state;

an access circuit configured to apply a first voltage to a first electrode of a selected memory cell from among the plurality of memory cells and apply a second voltage to a second electrode of the selected memory cell; and a sense circuit configured to determine a logic state of the selected memory cell based on electrical reactions of a first sensing node and a second sensing node connected to the selected memory cell with regard to the first voltage and the second voltage, wherein the sense circuit comprises:

a first capacitor connected between the first sensing node and a sensing input node;

a second capacitor connected between the second sensing node and the sensing input node;

a pre-charger configured to pre-charge the sensing input node with a pre-charge voltage based on a pre-charge control signal; and a comparing circuit configured to compare a voltage level of the sensing input node with a voltage level of a reference voltage and output a signal indicating the logic state of the selected memory cell.

16. The memory device of claim 15, wherein the access circuit is further configured to program the selected memory cell to logic "1" by using a positive programming voltage pulse that applies the first voltage having a first magnitude to the first electrode and applies the second voltage having a second magnitude smaller than the first magnitude to the second electrode.

17. The memory device of claim 16, wherein the access circuit is further configured to provide:

a positive read voltage pulse for applying the first voltage having a third magnitude to the first electrode and the second voltage having a fourth magnitude smaller than the third magnitude to the second electrode, and a negative read voltage pulse for applying the first voltage having a fifth magnitude to the first electrode and applying the second voltage having a sixth magnitude greater than the fifth magnitude to the second electrode, and wherein the first sensing node indicates a low threshold voltage due to the positive read voltage pulse, and the second sensing node indicates a high threshold voltage due to the negative read voltage pulse.

18. The memory device of claim 15, wherein the access circuit is further configured to program the selected memory cell to logic "0" by using a negative programming voltage pulse that applies the first voltage having a first magnitude to the first electrode and applies the second voltage having a second magnitude greater than the first magnitude to the second electrode.

19. The memory device of claim 18, wherein the access circuit is further configured to provide:

a positive read voltage pulse for applying the first voltage having a third magnitude to the first electrode and the second voltage having a fourth magnitude smaller than the third magnitude to the second electrode, and a negative read voltage pulse for applying the first voltage having a fifth magnitude to the first electrode and applying the second voltage having a sixth magnitude greater than the fifth magnitude to the second electrode, and wherein the first sensing node indicates a high threshold voltage due to the positive read voltage pulse, and the second sensing node indicates a low threshold voltage due to the negative read voltage pulse.

20. The memory device of claim 15, wherein the plurality of memory cells include phase change memory cells.

* * * * *